(12) United States Patent
Dellit et al.

(10) Patent No.: US 11,303,272 B2
(45) Date of Patent: Apr. 12, 2022

(54) SWITCHING APPARATUS AND METHOD FOR OPERATING A SWITCHING APPARATUS

(71) Applicant: LEONI BORDNETZ-SYSTEME GMBH, Kitzingen (DE)

(72) Inventors: Marcus Dellit, Wuerzburg (DE); Christoph Kirsch, Wuerzburg (DE); Bernhard Schraud, Wuerzburg (DE); Joachim Neubert, Wuerzburg (DE)

(73) Assignee: LEONI Bordnetz-Systeme GmbH, Kitzingen (DE)

(*) Notice: Subject to any disclaimer, the term of this patent is extended or adjusted under 35 U.S.C. 154(b) by 93 days.

(21) Appl. No.: 16/819,389

(22) Filed: Mar. 16, 2020

(65) Prior Publication Data

US 2020/0295747 A1    Sep. 17, 2020

(30) Foreign Application Priority Data

Mar. 15, 2019  (DE) .......................... 102019203508.6

(51) Int. Cl.
| | |
|---|---|
| *H03K 17/082* | (2006.01) |
| *H03K 17/08* | (2006.01) |
| *H03K 17/0814* | (2006.01) |
| *H03K 17/0812* | (2006.01) |
| *H03K 17/12* | (2006.01) |
| *H01H 9/54* | (2006.01) |

(Continued)

(52) U.S. Cl.
CPC . *H03K 17/08142* (2013.01); *G01R 19/16538* (2013.01); *G01R 31/327* (2013.01); *H01H 9/54* (2013.01); *H03K 17/08122* (2013.01); *H03K 17/122* (2013.01)

(58) Field of Classification Search
CPC ............... H03K 17/0822; H03K 17/08; H03K 17/08142; H03K 17/08122; H03K 17/122; H03K 2217/0063; H01H 9/54; G01R 31/327; G01R 19/16538
See application file for complete search history.

(56) References Cited

U.S. PATENT DOCUMENTS

| | | | |
|---|---|---|---|
| 7,781,918 B2 | 8/2010 | Crane | |
| 10,581,241 B2 * | 3/2020 | Lofthouse | ........ H03K 17/04206 |

(Continued)

FOREIGN PATENT DOCUMENTS

| | | |
|---|---|---|
| DE | 10046668 A1 | 3/2001 |
| EP | 3444624 A1 | 2/2019 |

*Primary Examiner* — Sisay G Tiku
(74) *Attorney, Agent, or Firm* — Laurence A. Greenberg; Werner H. Stemer; Ralph E. Locher

(57) ABSTRACT

A switching apparatus electrically connects an electrical load to an energy source and contains a main current path which has a switching unit with a circuit breaker, via which the electrical load is connected to the energy source in a supply mode. An auxiliary current path is connected in parallel with the main current path and in which a first switch is arranged. A disconnection mode is performed in which the circuit breaker is open and the electrical load is connected only to the auxiliary current path to reduce electrical energy stored inside the electrical load. A diagnostic mode is also provided, in which the switching unit is open and the electrical load is connected to the energy source only via the auxiliary current path to supply the electrical load. A control unit for activating the diagnostic mode is also provided.

18 Claims, 2 Drawing Sheets

(51) Int. Cl.
*G01R 31/327* (2006.01)
*G01R 19/165* (2006.01)

(56) References Cited

U.S. PATENT DOCUMENTS

| | | | |
|---|---|---|---|
| 10,811,864 B2* | 10/2020 | Dupraz | H01H 9/54 |
| 2002/0109477 A1 | 8/2002 | Ikezawa | |
| 2009/0109586 A1 | 4/2009 | Scheikl et al. | |
| 2015/0022928 A1* | 1/2015 | Mohaddes Khorassani | H02H 1/0007 361/93.7 |
| 2015/0303683 A1* | 10/2015 | Barnette | H02H 9/004 361/93.9 |
| 2016/0282893 A1* | 9/2016 | Cooper | H01L 43/02 |
| 2016/0352318 A1* | 12/2016 | Amit | H03K 5/08 |
| 2019/0128965 A1 | 5/2019 | Park et al. | |
| 2021/0165044 A1* | 6/2021 | Imura | H02J 7/342 |

\* cited by examiner

SWITCHING APPARATUS AND METHOD FOR OPERATING A SWITCHING APPARATUS

CROSS-REFERENCE TO RELATED APPLICATION

This application claims the priority, under 35 U.S.C. § 119, of German application DE 10 2019 203 508, filed Mar. 15, 2019; the prior application is herewith incorporated by reference in its entirety.

BACKGROUND OF THE INVENTION

Field of the Invention

The invention relates to a switching apparatus and to a method for operating a switching apparatus for electrically connecting an electrical load to an energy source.

In electrical supply networks, in particular in motor vehicle electrical systems, the electrical consumers which are present are usually electrically connected to an energy source via switching apparatuses. A battery of the motor vehicle, for example, is used as the energy source in this case.

The switching apparatuses usually have electronic circuit breakers which are arranged as a separating element between the consumers and the energy source. The consumers of interest here are, in particular, high-current consumers, for example electric motors, which have a current consumption of >10 A or >50 A and, in particular, >100 A during operation.

In order to ensure the function of the circuit breakers, their functionality must usually be checked. At the same time, however, an electrical energy supply for the respective consumer, which is connected to the energy source via the circuit breaker to be tested, is not intended to be interrupted.

The circuit breakers are also intended to be protected, during disconnection, that is to say opening, from negative voltage pulses which arise when disconnecting inductive loads, in particular.

BRIEF SUMMARY OF THE INVENTION

On the basis of this, the invention is based on the object of specifying a switching apparatus and a method for operating a switching apparatus, with the aid of which an electrical consumer is reliably connected to the electrical energy source.

The object directed to the switching apparatus is achieved, according to the invention, by means of a switching apparatus having the features of the independent apparatus claim.

The subclaims relate to advantageous configurations, developments and variants.

The switching apparatus is, in particular, in the form of a switching apparatus for a motor vehicle electrical system and is used to electrically connect an electrical load to an energy source. In this case, the electrical load is understood as meaning, for example, any type of electrical consumers inside the motor vehicle and preferably inductive loads. In this case, the term "load" comprises one or more consumers. Specifically, the load is a high-current load, as defined at the outset. In this case, the energy source is preferably understood as meaning a motor vehicle battery or a voltage transformer which is arranged inside the motor vehicle.

The switching apparatus contains a main current path having a switching unit with at least one circuit breaker. The main current path and the switching unit are configured to supply the load connected thereto (one or more consumers) with a (maximum) overall operating current. This overall operating current is, in particular, >10 A or >50 A and, in particular, >100 A up to 1000 A, for example, in particular in the case of short-term load situations. In the present case, a circuit breaker is generally understood as meaning a switch for switching an electrical power, in particular for switching electrical currents having a current intensity of at least 1 A, preferably of at least 5 A or of at least 10 A. A plurality of circuit breakers are usually arranged parallel to one another in the switching unit. The circuit breaker(s) is/are preferably in the form of a semiconductor switch and, in particular, in the form of a power MOSFET. The latter is used to connect the electrical load to the energy source in a supply mode. The supply mode is understood as meaning an (operating) mode of the switching apparatus which corresponds to an operating state in which the at least one circuit breaker is closed and preferably connects the electrical load to the energy source constantly, that is to say continuously, with the result that the electrical load is supplied with electrical energy.

The switching apparatus also has an auxiliary current path which is connected in parallel with the main current path and in which a first switching element is arranged.

A disconnection mode is provided, in which the supply of the load is interrupted via the main current path, that is to say the load is disconnected. This is carried out by opening the switching unit, that is to say the circuit breakers arranged therein. In this case, disconnection is understood as meaning the fact that the circuit breakers are switched from an on state to an off state, that is to say are opened. In the disconnection mode, the load is generally not supplied with electrical energy from the energy source.

A large amount of energy, in particular inductive energy, is stored in the at least one load connected via the switching unit and possibly inside the lines and has to be dissipated. For this purpose, a bypass or freewheeling path connected in parallel with the main current path is generally formed, to which the load is connected in the disconnection mode and via which the stored electrical energy is reduced and dissipated. For this purpose, the freewheeling path is generally connected via a switching element. At least one suitable consumer, for example one or more power resistors for reducing the stored energy, is arranged in the freewheeling path.

In this case, the freewheeling path is formed by the auxiliary current path. In the disconnection mode, the first switching element arranged in the auxiliary current path is therefore closed. In this respect, the electrical load is connected to the energy source only via the auxiliary current path in the disconnection mode.

The switching unit is disconnected and therefore opened in the event of a disconnection command and, in particular, when the electrical load has a fault, in order to disconnect the defective electrical load from the motor vehicle electrical system. Disconnection is also carried out, for example, when the corresponding request is affected by a superordinate control device which therefore outputs a disconnection command.

In the case of an electrical load in the form of an inductive load in particular, a negative voltage pulse (also referred to as a negative voltage peak) occurs when disconnecting and therefore severing the electrical connection between the electrical load and the energy source. According to the law of induction, this negative voltage pulse results from a drop in the load current flowing through the electrical load in the supply mode and the stored inductive energy inside the electrical load. This negative voltage pulse can result—if there is no freewheeling path—in the open at least one circuit breaker changing to an on state again, that is to say closing in an undesirable manner. The inductive energy stored inside the electrical load (also referred to as inductive disconnection energy) is then discharged inside the at least one circuit breaker after the undesirable closing, which can result in overloading of the circuit breaker and therefore in failure of the circuit breaker and consequently of the switching apparatus.

Since the electrical load is connected to the energy source only via the auxiliary current path in the disconnection mode, the inductive energy of the electrical load flows away via the auxiliary current path and is consumed. For this purpose, the power consumer already mentioned is arranged in the auxiliary current path. The power consumer has, in particular, a plurality of power resistors connected in series. The at least one circuit breaker is therefore protected in the disconnection mode. As a result, the auxiliary current path is also referred to as a bypass path.

A diagnostic mode is also provided, in which the switching unit is likewise open, that is to say the supply of the load via the main current path is prevented. The electrical load is connected to the energy source only via the auxiliary current path and is supplied with energy from the energy source via the auxiliary current path. Within the diagnostic mode, the electrical connection of the electrical load to the energy source by means of the auxiliary current path is therefore used to supply the electrical load, unlike in the disconnection mode. As a result, despite the open switching unit in the diagnostic mode, a supply of electrical energy to the electrical load is not interrupted. Therefore, in addition to the supply via the main current path, the electrical load is also supplied via the auxiliary current path and interruption-free electrical supply of the electrical load is ensured even when the switching unit in the main current path is open.

In the diagnostic mode, the switching apparatus and possibly the load connected thereto are also diagnosed. In particular, the functionality of the circuit breaker(s) of the switching unit is checked.

A control unit is also provided and is used to activate the individual different modes and, in particular, the diagnostic mode, specifically by actuating the various switching elements, that is to say, for example, by actuating the switching unit in the main current path and the first switching element in the auxiliary current path. The control unit is preferably in the form of a microcontroller.

The switching apparatus and the different modes (supply mode, disconnection mode and diagnostic mode) implement a switching apparatus which is configured, on the one hand, to reduce inductive energy stored inside the electrical load upon disconnection and, on the other hand, to ensure an interruption-free electrical supply of the electrical load, in particular when the at least one circuit breaker is in the open, that is to say off, state in the diagnostic mode for checking its functionality.

The auxiliary current path and, in particular, the first switching element arranged therein for opening and closing the auxiliary current path are preferably configured in this case only for part (for example a maximum of 50%, a maximum of 25% and more preferably at least for 5% or 10%) of the (maximum) overall operating current, whereas the main current path and the switching unit arranged therein are designed for the (maximum) overall operating current.

According to one preferred configuration, the first switching element is configured in such a manner that it is automatically closed and connects the load to the power consumer in order to reduce the stored electrical energy when the load is disconnected. Active actuation is therefore not required. The bypass or freewheeling path is therefore enabled independently of a control command solely on the basis of the voltage pulses which occur during disconnection.

In particular, for this purpose, the switching element is in the form of a semiconductor switch, in particular in the form of a MOSFET and especially in the form of a power MOSFET. The first switching element therefore has a gate connection with a gate voltage potential. The first switching element also has a source connection, to which the electrical load is connected. In this case, a drain connection of the first switching element is preferably connected to the energy source. The gate voltage potential is preferably electrically connected to a ground potential via a ground connection.

This preferred configuration is based on the idea that, if the negative voltage pulse is present when disconnecting the at least one circuit breaker, the electrical load is automatically connected to the energy source via the auxiliary current path by virtue of the gate voltage potential being electrically connected to the ground potential. In other words, the first switching element in the auxiliary current path is closed by virtue of the fact that the negative voltage pulse results in a voltage difference between the gate voltage potential and the source voltage potential, the value of which voltage difference has at least the same value as and preferably a greater value than a (predefined and stipulated) control voltage which must be applied between the gate connection and the source connection so that the first switching element changes from an off (high-impedance) state to an on (low-impedance) state. The first switching element is therefore automatically closed in the disconnection mode on account of the disconnection behavior of the inductive load. No active and/or external switching signal is consequently required, in particular. The advantage of this configuration can be seen in a simplification of the switching effort, on the one hand, and in a need for active monitoring which is not required, on the other hand.

The auxiliary current path preferably has a diode which is arranged between the gate connection of the first switching element and the ground potential. The diode is preferably electrically connected to the ground potential in the reverse direction.

A resistance element is expediently arranged in the auxiliary current path as a power consumer. The resistance element is preferably a non-reactive resistor and is especially a power resistor. The resistance element is used to convert the electrical and preferably inductive energy stored inside the electrical load in the disconnection mode. The electrical energy is converted into thermal energy by the resistance element in the disconnection mode. As a result of the arrangement of the resistance element, the electrical energy of the electrical load is easily and reliably converted and therefore dissipated in the disconnection mode. Furthermore, as a result of the special configuration of the resistance element as a power resistor and the special configuration of the first switching element as a power MOSFET, these components have a high temperature resistance.

In addition to the suitability for switching high currents and energies, the entire switching apparatus (especially the resistance element and the first switching element and the switching unit) is also generally configured for a high temperature load situation in such a manner that its functionality is not impaired in a temperature range of preferably 100° C. to 150° C. The switching apparatus is therefore also suitable for arrangement in regions having high thermal loads. For example, it is used in the region of a drive motor of a vehicle.

According to one preferred configuration, the gate voltage potential of the first switching element in the diagnostic mode has the same value as a voltage potential of the energy source. In this case, the same value is understood as meaning the fact that the value of the gate voltage potential corresponds substantially to a value of the voltage potential of the energy source. In this case, substantially is understood as meaning the fact that the gate voltage potential has a value which has the same value as the voltage potential of the energy source, apart from possible tolerances on account of voltage drops which occur during the switching operations. The voltage potential of the energy source is understood as meaning, for example, an operating voltage of the battery arranged inside the motor vehicle or an output voltage of the voltage transformer which has already been mentioned.

A second switching element is preferably provided for electrically connecting the gate connection of the first switching element to the energy source in the diagnostic mode. As a result, the voltage potential of the energy source is therefore applied to the gate connection of the first switching element. In this case, the gate connection is preferably electrically connected to a phase connection, which is to say to a "positive pole" of the energy source. Reversible and switchable electrical connection of the gate connection to the energy source in the diagnostic mode is achieved by means of the second switching element.

In the case of the above-mentioned activation of the diagnostic mode by the control unit, the gate connection is therefore electrically connected to the energy source by closing the second switching element.

According to one expedient development, the control unit is configured to capture an electrical output voltage applied to the electrical load. For this purpose, the control unit either has a voltage capture unit or is connected to such a voltage capture unit. In this case, the electrical output voltage is understood as meaning the voltage used to supply the electrical load.

This development is based on the idea that, if the load is electrically supplied via the auxiliary current path in the diagnostic mode, the output voltage applied to the electrical load has a value which is preferably 2 V to 4 V lower than the output voltage if the electrical load is electrically connected to the energy source via the main current path. This voltage difference in the output voltage is based on the fact that, when the first switching element is closed, as a result of the gate connection of the first switching element being electrically connected to the energy source and therefore the gate voltage potential being connected to the voltage potential of the energy source in the diagnostic mode, a part of the supply voltage of the energy source is dropped across the first switching element and the output voltage applied to the electrical load in the diagnostic mode is therefore reduced. In this case, the part of the supply voltage is understood as meaning the 2 V to 4 V already mentioned.

Overall, it can therefore be discerned from the output voltage whether the main current path is disconnected and the auxiliary current path is closed. It is therefore possible to distinguish between the circuit states of the supply mode and of the diagnostic mode by virtue of the control unit capturing the output voltage applied to the electrical load. Specifically, this makes it possible to easily determine in a reliable manner whether the prerequisites for the diagnosis to be performed are present. Accordingly, in a preferred development, starting of the diagnosis on the basis of the captured output voltage is provided, that is to say, in particular, starting of the check of the circuit breakers of the switching unit.

The control unit is preferably configured to check the at least one circuit breaker in the diagnostic mode. In this case, the control unit is configured to check, in particular, the functionality of the at least one circuit breaker. This check takes place here without a supply of the load being interrupted. The check takes place, in particular, in a low-consumption state, that is to say if only a part of the overall operating current is required by the connected load.

The control unit is preferably connected to a current measuring element. Alternatively, the control unit has a current measuring element. The current measuring element is configured in this case to capture a load current flowing through the electrical load. The control unit is also configured to change over between the supply mode and the diagnostic mode on the basis of a value of the captured load current by actuating the first switching element and preferably by actuating the at least one circuit breaker.

This configuration is based on the idea of selecting a time of the diagnosis and therefore the activation of the diagnostic mode of the at least one circuit breaker in such a manner that the diagnostic mode is activated when a current consumption of the electrical load and therefore an electrical load current flowing through the latter are low. In this case, the low current consumption is understood as meaning a current consumption which occurs, for example, when the electrical load is in a quiescent state (also referred to as a standby state) or generally in a state of low current requirement. In this case, the quiescent state is understood as meaning a state of the electrical load in which either no functions or preferably only some of all functions of the electrical load are active. If the electrical load is in such a quiescent state and if this is detected by virtue of the control unit capturing a lower load current, the control unit switches from the supply mode to the diagnostic mode and therefore checks the at least one circuit breaker, while the electrical supply of the electrical load is ensured via the auxiliary current path. If necessary, there is generally a changeover to the diagnostic mode when the load current is less than the current for which the auxiliary current path is configured, that is to say, for example, less than 50% or less than 25% or even less than 10% of the (maximum) overall operating current for which the switching unit in the main current path is configured. The diagnostic mode is preferably activated only when the load is in such a state of low current requirement.

Alternatively, the switching unit is externally actuated, for example via an actuation unit. In this case, the actuation unit receives, from the control unit, a switching command to open or close the switching unit in order to thus change over between the supply mode and the diagnostic mode and vice versa.

According to one preferred configuration, the auxiliary current path is generally configured for a lower current than the main current path. This applies, for example, to the switching elements used in the two current paths and/or also with regard to the (overall) line cross sections in the two paths. This configuration is based on the idea that, as already mentioned above, the auxiliary current path is preferably used during the diagnostic mode to electrically supply the electrical load, in particular in the quiescent state. As a result, the auxiliary current path is exposed to a lower current load than the main current path in the diagnostic mode. Material and cost savings are also achieved by designing the auxiliary current path for lower currents.

The important advantage of the switching apparatus described above can be seen in the two feasible functions of the switching apparatus, namely a reduction in the electrical energy inside the electrical load during disconnection (disconnection mode), on the one hand, and ensuring the electrical supply when checking the at least one circuit breaker (diagnostic mode), on the other hand, wherein the disconnection mode and the diagnostic mode are substantially both implemented by use of the auxiliary current path. The decisive factor in this case is also the fact that the first switching element is connected and can be actuated in such a manner that it automatically switches for the disconnection mode and can be actively changed to the closed state for the diagnostic mode. A dual function is therefore achieved via the auxiliary current path and via the first switching element in combination with the second switching element.

The object directed to the method is achieved, according to the invention, by means of a method for operating a switching apparatus having the features of the independent method claim. The method is used, in particular, to electrically connect an electrical load to an energy source by means of the switching apparatus.

The switching apparatus is, in particular, the switching apparatus already mentioned above.

In the method, the electrical load is therefore connected to the energy source in a supply mode via a main current path, having at least one circuit breaker, by closing the at least one circuit breaker.

In a disconnection mode, the at least one circuit breaker is opened and the electrical load is connected to the energy source only via an auxiliary current path, having a first switching element, by closing the first switching element. In this case, electrical energy stored inside the electrical load is reduced via the auxiliary current path. A resistance element for converting the electrical energy into thermal energy is preferably arranged in this case inside the auxiliary current path.

The at least one circuit breaker is opened and the first switching element is closed in a diagnostic mode. In this case, the electrical load is connected to the energy source only via the auxiliary current path, wherein the at least one circuit breaker is checked in the diagnostic mode and an electrical energy supply of the electrical load via the auxiliary current path is ensured at the same time.

The first switching element is preferably in the form of a semiconductor switch which is automatically closed in the disconnection mode by means of a negative voltage pulse originating from the load after disconnection.

Furthermore, the first switching element is preferably actively closed in the diagnostic mode by means of a second switching element.

The advantages and preferred configurations cited with respect to the switching apparatus can be analogously applied to the method and vice versa.

Other features which are considered as characteristic for the invention are set forth in the appended claims.

Although the invention is illustrated and described herein as embodied in a switching apparatus and a method for operating a switching apparatus, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Mutually corresponding parts are each provided with the same reference signs in all figures.

Figure 1:
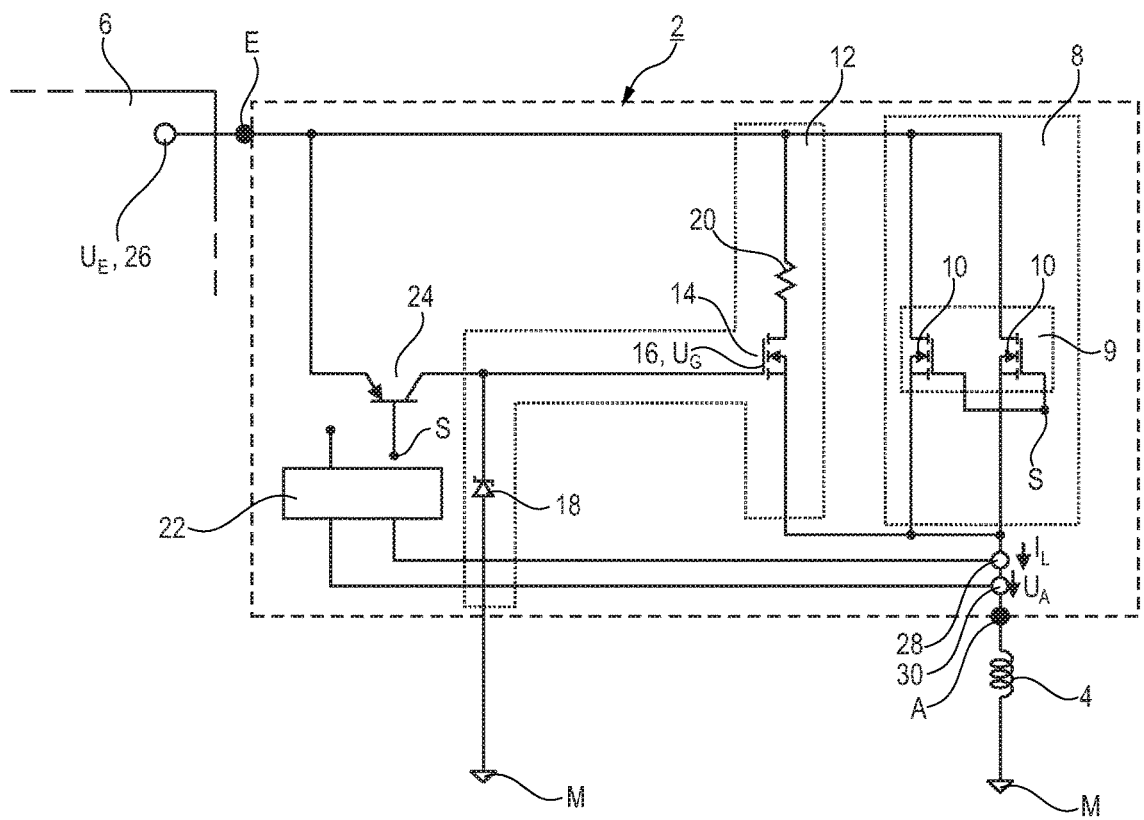
FIG. 1 is a schematic circuit diagram of a switching apparatus according to the invention.

Referring now to the figures of the drawings in detail and first, particularly to FIG. 1 thereof, there is shown a switching apparatus 2 illustrated schematically and designed, in particular, for a motor vehicle electrical system and is used to electrically connect an electrical load 4 to an energy source 6. The electrical load is one or more consumers, for example an electric motor. In the exemplary embodiment, the electrical load 4 is in the form of an inductive load 4 and is therefore illustrated as a coil in the circuit diagram according to FIG. 1. The energy source 6 is only indicated in FIG. 1. The energy source 6 is, for example, a battery of the motor vehicle which is not illustrated, a voltage transformer or a capacitor which is arranged in the motor vehicle. The switching apparatus 2 has an input E, which is connected to the energy source 6, and an output A, to which the load 4 is connected. During operation, an electrical load or output voltage $U_A$ is applied to the output A and therefore also to the electrical load 4 and a load current $I_L$ is provided at the output A.

The switching apparatus 2 also has a main current path 8 which has a switching unit 9 with at least one circuit breaker 10 and preferably a plurality of circuit breakers 10 connected in parallel with one another. In the exemplary embodiment, the switching apparatus 2 has two circuit breakers 10. In the exemplary embodiment, the circuit breakers 10 are in the form of power MOSFETs. The electrical load 4 is electrically connected to the energy source 6 in a supply mode via the circuit breakers 10. In this case, the supply mode is understood as meaning normal operation of the switching apparatus 2, in which the circuit breakers 10 are preferably permanently closed, that is to say on. The main current path 8 and the switching unit 9 are designed for a maximum overall operating current typically in the range of greater than 50 to 500 A or even 1000 A, for example, especially in the case of short-term load situations.

The switching apparatus 2 also has an auxiliary current path 12 which is connected in parallel with the main current path 8 and in which a first switching element 14 in the form of a semiconductor switch in the exemplary embodiment is arranged. An electrically conductive connection between the energy source 6 and the electrical load 4 can therefore likewise be achieved by means of the first switching element 14. A power consumer, in particular a resistor 20, is also arranged in series with the first switching element 14 in the auxiliary current path 12.

The first switching element 14 has a gate connection 16 with a gate voltage potential $U_G$. The gate connection 16 and therefore the gate voltage potential $U_G$ are electrically connected to a ground potential M. The auxiliary current path 12 likewise has a diode 18 which is arranged between the gate connection 16 and the ground potential M and is electrically connected to the ground potential M in the reverse direction.

A second switching element 24 is also provided as part of the switching apparatus 2 and is used to electrically connect the gate connection 16 of the first switching element 14 to the energy source 6, in particular to a phase connection 26 ("positive pole") of the energy source 6, in a switchable manner.

Finally, a control unit 22 is provided and is used to actuate different functions of the switching apparatus 2, as is also explained below. Specifically, the control unit 22 is also used to actuate the circuit breakers 10 and the second switching element 24. For this purpose, the control unit is respectively connected to a control connection S of the respective switching element 10, 24 in a manner which is not described in any more detail here.

Disconnection Mode:

The electrical connection of a gate connection 16 and therefore of the gate voltage potential $U_G$ to the ground potential M is used to automatically close the first switching element 14 in a disconnection mode. In this case, the disconnection mode is understood as meaning an operating mode of the switching apparatus 2 in which the load 4 is disconnected by disconnecting the switching unit 9, that is to say the switching unit 9 is opened.

(Residual) energy is stored inside the load 4 and possibly inside a supply line to the load 4. In the case of an inductive load 4, a negative counter-voltage in the form of a negative voltage pulse results from the law of induction and the drop in the load current and the inductive energy stored in the load 4.

On account of the electrical connection of the gate connection 16 to the ground potential M, a control voltage at the gate connection 16 of the first switching element 14 is exceeded as a result of the negative voltage pulse during disconnection and the first switching element 14 is therefore automatically closed.

As a result, the electrical load 4 is automatically electrically connected to the energy source 6 via the auxiliary current path 12 if the load 4 is disconnected. A current which still flows after the disconnection on account of the stored energy is therefore discharged via the auxiliary current path 12. The stored electrical (residual) energy is converted into thermal energy in the resistor 20. As a result, the circuit breakers 10 of the switching unit 9 in the main current path 8 are protected.

If the counter-voltage falls below a particular value again, the first switching element 14 automatically opens again, with the result that the load 4 is completely disconnected from the energy source 6.

The disconnection mode is therefore used to reduce the electrical energy stored inside the electrical load 4 when the switching unit 9 is disconnected.

Figure 2:
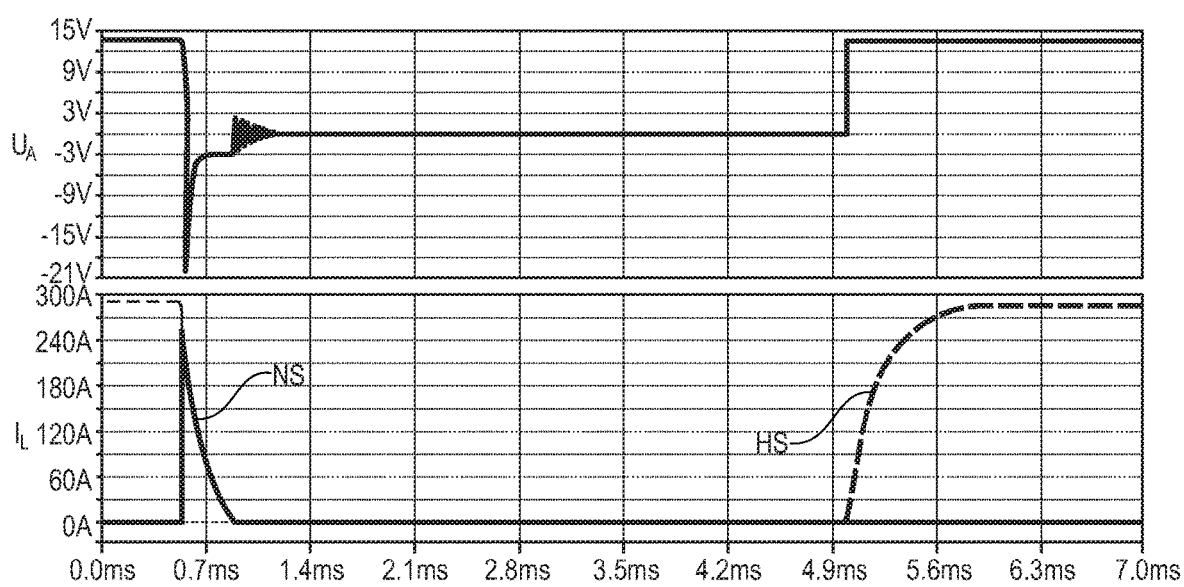
FIG. 2 is a graph showing, by way of example, a profile of an output voltage of the switching apparatus and of a load current when disconnecting and reconnecting a load.

The voltage and current profile during disconnection, that is to say during the disconnection mode, is described by way of example on the basis of FIG. 2.

The upper curve shows the profile of the output voltage $U_A$ at the output A and therefore the load voltage applied to the load 4. The lower curve shows the profile of the load current $I_L$. In this case, the dashed line "HS" shows the profile of the load current $I_L$ across the main current path 8 and the solid, thick line "NS" shows the profile of the load current $I_L$ across the auxiliary current path 12. The values indicated for the voltage and the current are merely exemplary, but realistic values.

At a time of approximately 0.5 ms, the load 4 is disconnected via the switching unit 9, that is to say the circuit breakers 10 are opened. This results in a negative voltage pulse (for example from +15 V to approximately −20 V). After the disconnection, the load current $I_L$ continuously falls from a nominal current of, for example, several 100 A (for example approximately 300 A) to 0 A within a few nanoseconds or milliseconds. As a result of the negative voltage pulse, the first switching element 14 is closed and the load current $I_L$ flows away via the auxiliary current path 12. If the load or output voltage $U_A$ increases to a particular value again, approximately −3 V in the example, the first switching element 14 opens again and the load 4 is disconnected from the energy source 6.

After the switching unit 9 has been connected, at approximately 5 ms in the example, the load current $I_L$ and the output voltage $U_A$ increase to the initial values again.

Diagnostic Mode:

A diagnostic mode is also provided, in which the switching unit 9 is likewise open and the electrical load 4 is connected to the energy source 6 only via the auxiliary current path 12. One or more of the circuit breakers 10, in particular, is checked during the diagnostic mode.

A control unit 22, which is part of the switching apparatus 2 in the exemplary embodiment according to FIG. 1, is provided for this purpose. The control unit 22 is preferably in the form of a microcontroller or has such a microcontroller. The control unit 22 is not necessarily part of the switching apparatus. For example, it is in the form of an independent structural unit or is arranged in such a structural unit. It is arranged away from the switching apparatus or from the remaining parts of the switching apparatus 2, for example. It is a superordinate control device, for example. The individual components of the switching apparatus 2—with or without the control unit 22—are preferably arranged on a common printed circuit board.

The control unit 22 is also configured to activate the diagnostic mode. For this purpose, the second switching element 24 is suitably actuated by the control unit 22, with the result that the gate connection 16 of the first switching element 14 is connected to the energy source 6.

As a result of the electrical connection of the gate connection 16 of the first switching element 14 to the phase connection 26 of the energy source 6, the gate voltage potential $U_G$ in the diagnostic mode has the same value as a voltage potential $U_E$ of the energy source. In this case, the voltage potential $U_E$ of the energy source 6 corresponds, for example, to an operating voltage of the motor vehicle battery.

As a result of this measure, the first switching element 14 is closed, with the result that the load 4 is connected to the energy source 6 via the auxiliary current path 12. The deactivated circuit breakers 10 can then be checked as part of the provided diagnosis.

In principle, it should be pointed out that the load (that is to say the consumer(s)) is operated in a plurality of different load states. This is controlled by means of a control apparatus which is not illustrated any further here. If the load/consumer is an electric motor, for example, its load and current consumption is controlled by the control apparatus in accordance with the requirements.

The diagnosis is generally carried out without the load 4 being disconnected from the energy source 6. In this case, the diagnosis is carried out during low-load operating states of the load 4. In order to ensure that the diagnosis is safely carried out in low-load states while simultaneously supplying the load 4, special measures are provided:

The control unit 22 is first of all configured to capture the electrical output voltage $U_A$. For this purpose, the control unit 22 is connected to a voltage capture unit 30 in the exemplary embodiment. The control unit 22 is also configured to distinguish between the supply mode and the diagnostic mode on the basis of the captured output voltage $U_A$. This configuration is based on the idea that the output voltage $U_A$ in the diagnostic mode is preferably 2 V to 4 V lower than the output voltage $U_A$ in the supply mode. The supply mode is generally characterized by the fact that the switching unit 9 is closed and the first switching element 14 is additionally preferably open.

Voltage values which are characteristic both of the supply mode and of the diagnostic mode are therefore available for the output voltage $U_A$ and can be used by the control unit 22 to distinguish the two modes (supply mode and diagnostic mode), that is to say specifically the switching states of the switching unit 9 and of the first switching element 14, from one another.

The control unit 22 is also configured to determine the instantaneous load current $I_L$ and, for this purpose, is connected, for example, to a current measuring element 28 of the switching apparatus 2. Alternatively, the control unit 22 also receives the information relating to the instantaneous load current $I_L$ in another manner, for example from a control apparatus, for example a motor controller of a motor used as the load. However, this is not provided in the preferred embodiment variant.

In the exemplary embodiment, the current measuring element 28 is used to directly measure the load current $I_L$ flowing through the electrical load 4. The control unit 22 is also configured to change over between the supply mode and the diagnostic mode on the basis of a value of the captured load current $I_L$ by actuating the first switching element 14 and the at least one circuit breaker 10. If a low-load state is therefore detected on the basis of the load current $I_L$, the auxiliary current path 12 is activated by closing the first switching element 14 in a controlled manner (by means of the second switching element 24).

The control unit 22 is preferably also configured to actuate the circuit breakers 10 in order to open the latter. As a result, there is a changeover overall from the supply mode, in which the switching unit 9 is closed and the first switching element 14 is open, to the diagnostic mode. For this purpose, the control unit 22 transmits the control or switching signals mentioned to the respective control connection, which signals cause the circuit breakers 10 to be opened and the first switching element 14 to be closed. In this case, the first switching element 14 is preferably closed temporally (quickly, less than 1 ms) before the at least one circuit breaker 10 is opened, with the result that the electrical load 4 is electrically connected to the energy source 6 both via the main current path 8 and via the auxiliary current path 12 over a short period. The electrical supply of the electrical load 4 via the auxiliary current path 12 therefore achieves interruption-free electrical supply of the electrical load, in particular in the diagnostic mode.

Figure 3:
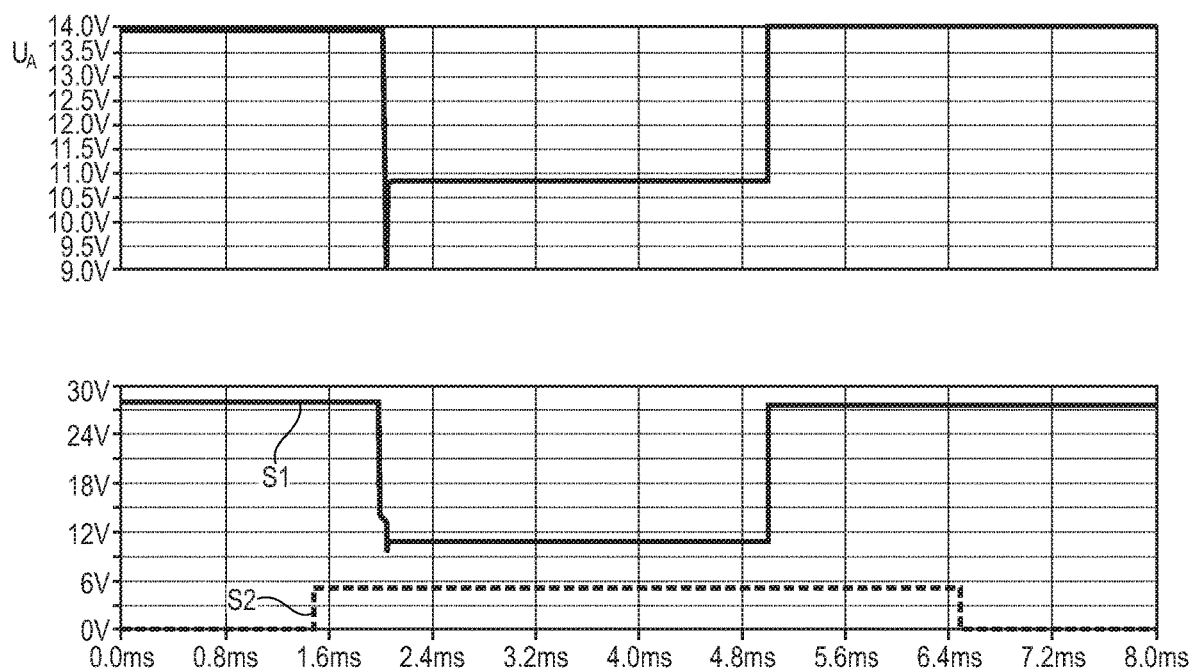
FIG. 3 is a graph showing, by way of example, the profile of the output voltage of the switching apparatus on a basis of actuation signals for switching elements.

Changing over between the supply mode and the diagnostic mode is illustrated on the basis of FIG. 3.

The upper curve shows the profile of the output voltage $U_A$ which can be used to distinguish between the two modes. The lower partial image shows two curves, wherein the upper curve shows the profile of a first switching signal S1 for switching the switching unit 9 and the lower curve shows the profile of a second switching signal S2 for switching the second switching element 24.

As can be readily seen, the switching signal S1 is initially at a high level in the supply mode, with the result that the circuit breakers are actuated in such a manner that they, and therefore the main path 8, are closed. The switching signal S2 is then additionally applied to the second switching element 24, with the result that the auxiliary current path 12 is also closed and a supply is provided via both paths 8, 12 for a short time. The control voltage of the first switching signal is then reduced at least to the extent that the circuit breakers 10 are opened. This becomes noticeable in the output voltage as a result of a characteristic voltage drop by approximately 3 V. However, a sufficient output voltage $U_A$ is still applied, with the result that the load 4 is still supplied.

In this diagnostic mode, the diagnosis is carried out before there is then a changeover to the supply mode again (increase the control voltage for S1 and disconnect the control voltage for S2).

The invention is not restricted to the exemplary embodiment described above. Rather, other variants of the invention can also be derived therefrom by a person skilled in the art without departing from the subject matter of the invention. In particular, all individual features described in connection with the exemplary embodiment can furthermore also be combined with one another in another manner without departing from the subject matter of the invention.

LIST OF REFERENCE SIGNS

2 Switching apparatus
4 Electrical load
6 Energy source
8 Main current path
9 Switching unit
10 Circuit breaker
12 Auxiliary current path
14 First switching element
16 Gate connection
18 Diode
20 Resistance element
22 Control unit
24 Second switching element
26 Phase connection
28 Current measuring element
30 Voltage capture unit
$U_A$ Output voltage
$U_E$ Supply voltage of the energy source
$U_G$ Gate voltage potential
$I_L$ Load current
M Ground potential
E Input
A Output
S Control connection
S1 Switching signal
S2 Switching signal

The invention claimed is:

1. A switching apparatus for electrically connecting an electrical load to an energy source, the switching apparatus comprising:
a main current path having a switching unit with at least one circuit breaker, via which the electrical load is connected to the energy source in a supply mode;
an auxiliary current path connected in parallel with said main current path and in which a first switch is disposed;
a controller;

the switching apparatus being operable in a disconnection mode for disconnecting the load, in the disconnection mode said switching unit is open and the electrical load is connected to said auxiliary current path to reduce electrical energy stored inside the electrical load; and the switching apparatus being operable in a diagnostic mode, wherein in the diagnostic mode a functionality of said at least one circuit breaker of said switching unit being checked and wherein in the diagnostic mode said at least one circuit breaker is open and the electrical load is connected to the energy source only via said auxiliary current path to supply the electrical load, such that despite said switching unit being open in the diagnostic mode, during operation the electrical load is supplied with the electrical energy via said auxiliary current path such that an interruption-free electrical supply of the electrical load being ensured even when said switching unit in said main current path is open, and the diagnostic mode can be activated via said controller.

2. The switching apparatus according to claim 1, wherein said first switch is configured to automatically close upon disconnection of the electrical load.

3. The switching apparatus according to claim 1, wherein said first switch is a semiconductor switch and has a gate connection with a gate voltage potential which is electrically connected to a ground potential.

4. The switching apparatus according to claim 1, wherein:
said first switch has a gate connection; and
said auxiliary current path has a diode which is disposed between said gate connection of said first switch and a ground potential and is electrically connected to the ground potential in a reverse direction.

5. The switching apparatus according to claim 1, further comprising a power consumer disposed in said auxiliary current path to convert the electrical energy stored in the electrical load.

6. The switching apparatus according to claim 3, wherein the gate voltage potential of said first switch in the diagnostic mode has a same value as a voltage potential of the energy source.

7. The switching apparatus according to claim 2,
wherein said first switch has a gate connection; and
further comprising a second switch for electrically connecting said gate connection of said first switch to the energy source in the diagnostic mode.

8. The switching apparatus according to claim 1, wherein said controller is configured to capture an electrical output voltage applied to the electrical load.

9. The switching apparatus according to claim 1, wherein said controller is configured to start a performance of a diagnosis on a basis of an output voltage.

10. The switching apparatus according to claim 1, wherein said controller is configured to check said at least one circuit breaker in the diagnostic mode.

11. The switching apparatus according to claim 1, further comprising a current measuring element for capturing a load current of the electrical load, and said controller is configured to change over between the supply mode and the diagnostic mode on a basis of a value of the load current captured.

12. The switching apparatus according to claim 1, wherein said auxiliary current path is configured for a lower current than said main current path.

13. The switching apparatus according to claim 1, wherein the switching apparatus is for a motor vehicle electrical system.

14. A method for operating a switching apparatus for electrically connecting an electrical load to an energy source, which comprises the steps of:
connecting the electrical load to the energy source in a supply mode via a main current path, having a switching unit with at least one circuit breaker, by closing the switching unit;
disconnecting the electrical load in a disconnection mode and the switching unit is opened for this purpose and the electrical load is connected to an auxiliary current path, in order to reduce electrical energy stored inside the electrical load, by closing a first switch; and
opening the switching unit and the first switch is closed in a diagnostic mode, with a result that the electrical load is connected to the energy source only via the auxiliary current path, wherein a functionality of the at least one circuit breaker is checked in the diagnostic mode and the electrical load being supplied with electrical energy via the auxiliary current path such that an interruption-free electrical supply of the electrical load is ensured even when the switching unit in the main current path is open.

15. The method according to claim 14, which further comprises:
providing the first switch in a form of a semiconductor switch which is automatically closed in the disconnection mode by means of a voltage pulse originating from the electrical load after disconnection; and
actively closing the first switch in the diagnostic mode by means of a second switch.

16. The switching apparatus according to claim 7, wherein said first switch is a semiconductor switch which is automatically closed in the disconnection mode by means of a voltage pulse originating from the electrical load after disconnection and which is actively closed in the diagnostic mode by means of said second switch.

17. The switching apparatus according to claim 7, wherein said auxiliary current path with said first switch disposed therein for opening and closing said auxiliary current path are configured only for part of a maximum overall operating current, whereas said main current path and said switching unit disposed therein are configured for the maximum overall operating current.

18. A switching apparatus for electrically connecting an electrical load to an energy source, the switching apparatus comprising:
a main current path having a switching unit with at least one circuit breaker, via which the electrical load is connected to the energy source in a supply mode;
an auxiliary current path connected in parallel with said main current path and in which a first switch is disposed;
a controller;
a second switch connected between said controller and said first switch;
the switching apparatus being operable in a disconnection mode for disconnecting the load, in the disconnection mode said switching unit is open and the electrical load is connected to said auxiliary current path to reduce electrical energy stored inside the electrical load, said first switch being a semiconductor switch being automatically closed in the disconnection mode by means of a voltage pulse originating from the electrical load after disconnection; and
the switching apparatus being operable in a diagnostic mode, in the diagnostic mode said at least one circuit breaker is open and the electrical load is connected to the energy source only via said auxiliary current path to supply the electrical load by actively closing said first switch in the diagnostic mode by means of said second switch, and the diagnostic mode can be activated via said controller.

\* \* \* \* \*